US010680622B2

(12) United States Patent
Monk et al.

(10) Patent No.: US 10,680,622 B2
(45) Date of Patent: Jun. 9, 2020

(54) SPUR CANCELLER WITH MULTIPLIER-LESS CORRELATOR

(71) Applicant: Silicon Laboratories Inc., Austin, TX (US)

(72) Inventors: Timothy A. Monk, Hudson, NH (US); Rajesh Thirugnanam, Nashua, NH (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 16/143,711

(22) Filed: Sep. 27, 2018

(65) Prior Publication Data

US 2020/0106447 A1    Apr. 2, 2020

(51) Int. Cl.
*H03L 7/06* (2006.01)
*H03L 7/085* (2006.01)
*G04F 10/00* (2006.01)

(52) U.S. Cl.
CPC ............ *H03L 7/085* (2013.01); *G04F 10/005* (2013.01)

(58) Field of Classification Search
None
See application file for complete search history.

(56) References Cited

U.S. PATENT DOCUMENTS

| 7,061,276 B2* | 6/2006 | Xu ......................... G01R 25/04 327/113 |
| 7,064,616 B2* | 6/2006 | Reichert ............... G06F 1/0328 327/105 |
| 7,208,990 B1* | 4/2007 | Hassun .................. H03L 7/1806 327/156 |
| 7,391,839 B2* | 6/2008 | Thompson ................ H03L 7/16 327/156 |
| 7,605,662 B2* | 10/2009 | Kobayashi ........... H03D 13/004 331/11 |
| 7,746,972 B1* | 6/2010 | Melanson ............. H03L 7/0994 327/141 |

(Continued)

OTHER PUBLICATIONS

Avivi, R., et al., "Adaptive Spur Cancellation Technique in All-Digital Phase-Locked Loops," IEEE Transactions on Circuits and Systems-II: Express Briefs, vol. 64, No. 11, Nov. 2017, pp. 1291-1996.

(Continued)

*Primary Examiner* — Lincoln D Donovan
*Assistant Examiner* — Khareem E Almo
(74) *Attorney, Agent, or Firm* — Zagorin Cave LLP

(57) ABSTRACT

A spur cancellation circuit uses low cost multipliers in a correlation circuit. Each low cost multiplier multiplies a value of a sense node by a representation of a sinusoid and supplies a multiplication result. A compare circuit compares the sinusoid to one or more threshold values and supplies a compare indication. A multiplexer selects between two or more inputs including a positive value of the sense node and a negative value of the sense node, based on the compare result. A single threshold at zero converts the sinusoid to a square wave and the multiplexer supplies either the positive value or the negative value, which is equivalent to multiplying the value at the sense node by 1 or −1 depending on the sign of the sinusoid. Two thresholds may be used to represent the sinusoid with three values, the positive value, the negative value, or zero.

19 Claims, 5 Drawing Sheets

(56) References Cited

U.S. PATENT DOCUMENTS

| | | | |
|---|---|---|---|
| 8,207,766 B2 | 6/2012 | Yu | |
| 8,390,348 B2 | 3/2013 | Burcea | |
| 8,427,243 B2 | 4/2013 | Chen et al. | |
| 8,497,716 B2 | 7/2013 | Zhang | |
| 8,604,840 B2 | 12/2013 | Ahmadi et al. | |
| 8,947,139 B1 | 2/2015 | Vercesi et al. | |
| 8,957,712 B2 | 2/2015 | Tang et al. | |
| 9,071,195 B2* | 6/2015 | Gabbay | H03B 21/00 |
| 9,246,500 B2* | 1/2016 | Perrott | H03L 7/093 |
| 9,490,818 B2 | 11/2016 | Perrott | |
| 9,762,250 B2 | 9/2017 | Perrott | |
| 2008/0116946 A1 | 5/2008 | Masson | |
| 2008/0129352 A1 | 6/2008 | Zhang | |
| 2008/0218228 A1 | 9/2008 | Masson | |
| 2009/0132884 A1* | 5/2009 | Suda | G01R 31/31709 714/744 |
| 2009/0251225 A1 | 10/2009 | Chen et al. | |
| 2010/0097150 A1 | 4/2010 | Ueda et al. | |
| 2010/0213984 A1 | 8/2010 | Shin et al. | |
| 2011/0025388 A1 | 2/2011 | Lamanna | |
| 2011/0109356 A1* | 5/2011 | Ali | H03L 7/0816 327/158 |
| 2011/0133799 A1 | 6/2011 | Dunworth et al. | |
| 2011/0204938 A1 | 8/2011 | Lamanna | |
| 2012/0161832 A1 | 6/2012 | Lee et al. | |
| 2013/0050013 A1 | 2/2013 | Kobayashi et al. | |
| 2013/0112472 A1* | 5/2013 | Welland | H03L 7/18 174/350 |
| 2013/0222026 A1 | 8/2013 | Havens | |
| 2013/0257494 A1 | 10/2013 | Nikaeen et al. | |
| 2014/0077849 A1 | 3/2014 | Chen et al. | |
| 2014/0211899 A1 | 7/2014 | Furudate | |
| 2014/0266341 A1 | 9/2014 | Jang et al. | |
| 2015/0145567 A1 | 5/2015 | Perrott | |
| 2015/0145571 A1 | 5/2015 | Perrott | |
| 2015/0207514 A1* | 7/2015 | Kim | H03L 7/0992 455/73 |
| 2015/0008961 A1 | 8/2015 | Kim et al. | |
| 2016/0112053 A1 | 4/2016 | Perrott | |
| 2016/0359493 A1* | 12/2016 | Chen | H03L 7/099 |
| 2019/0068205 A1* | 2/2019 | Tamura | H03L 7/0802 |

OTHER PUBLICATIONS

Ho, C., and Chen, M., "A Fractional-N DPLL With Calibration-Free Multi-Phase Injection-Locked TDC and Adaptive Single-Tone Spur Cancellation Scheme," IEEE Transactions on Circuits and Systems-I: Regular Papers, vol. 63, No. 8, Aug. 2016, pp. 1111-1122.
Gupta, M. and Song, B.S., "A 1.8GHz Spur Cancelled Fractional-N Frequency Synthesizer with LMS Based DAC Gain Calibration," IEEE International Solid-State Circuits Conference, vol. 41, No. 12, Dec. 2006, pp. 2842-2851.
Hedayati, H. et al., "A 1 MHz Bandwidth, 6 GHz 0.18 μm CMOS Type-I ΔΣ Franctional-N Synthesizer for WiMAX Applications," IEEE Journal of Solid State Circuits, vol. 44, No. 12, Dec. 2009, pp. 3244-3252.
Hedayati, H. and Bakkaloslu, B., "A 3GHz Wideband ΣΔ Fractional-N Synthesizer with Voltage-Mode Exponential CP-PFD", IEEE Radio Frequency Integrated Circuits Symposium, 2009, pp. 325-328.
Hsu, C.M. et al., "A Low-Noise Wide-BW 3.6-GHz Digital ΔΣ Fractional-N Frequency Synthesizer with a Noise-Shaping Time-to-Digital Converter and quantization Noise Cancellation," IEEE Journal of Solid-State Circuits, vol. 43, No. 12, Dec. 2008, pp. 2776-2786.
Menninger, S. and Perrott, M., "A 1-MHz Bandwidth 3.6-GHz 0.18μm CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.
Pamarti et al., "A wideband 2.4GHz Delta-Sigma Fractional-N PLL with 1 Mb/s In-Loop Modulation," IEEE Journal of Solid-State Circuits, vol. 39, No. 1, Jan. 2004, pp. 49-62.
Staszewski, R.B. et al., "All-Digital PLL and Transmitter for Mobile Phones," IEEE Journal of Solid-State Circuits, vol. 40, No. 12, Dec. 2005, pp. 2469-2482.
Staszewski, R.B. et al., "1.3 V, 20 ps Time-to-Digital Converter for Frequency Synthesis in 90-nm CMOS," IEEE Transactions on Circuits and Systems-II, Express Briefs, vol. 53, No. 3, Mar. 2006, pp. 220-224.
Straayer, M.Z. and Perrott, M.H., A 12-Bit, 10-MHz Bandwidth, Continuous-Time ΣΔ ADC With a 5-Bit, 950-MS/s VCO-Based Quantizer, IEEE Journal of Solid-State Circuits, vol. 43, No. 4, Apr. 2008, pp. 805-814.
Swaminathan et al., "A Wide-Bandwidth 2.4 GHz ISM Band Fractional-N PLL with Adaptive Phase Noise Cancellation", IEEE Journal of Solid-State Circuits, vol. 42, No. 12, Dec. 2007, pp. 2639-2650.
Temporiti, E. et al., "A 700kHz Bandwith ΣΔ Fractional Synthesizer with Spurs Compensation and Linearization Techniques for WCDMA Applications," IEEE Journal of Solid-State Circuits, vol. 39, No. 9, Sep. 2004, pp. 1446-1454.
Li, Y., et al., "On-Chip Spur and Phase Noise Cancellation Techniques," IEEE Asian Solid-State Circuits Conference, Nov. 6-8, 2017, pp. 109-112.
U.S. Appl. No. 16/593,473, entitled "Spur Cancellation in a PLL System with an Automatically Updated Target Spur Frequency," filed Oct. 4, 2019, by Timothy A. Monk and Douglas F. Pastorello.
U.S. Appl. No. 16/018,598, entitled "Spur Cancellation for Spur Measurement," filed Jun. 26, 2018, by Timothy A. Monk and Rajesh Thirugnanam.
U.S. Appl. No. 16/143,717, entitled "Spur Cancellation with Adaptive Frequency Tracking," filed Sep. 27, 2018, by Timothy A. Monk and Rajesh Thirugnanam.

* cited by examiner

US 10,680,622 B2

SPUR CANCELLER WITH MULTIPLIER-LESS CORRELATOR

BACKGROUND

Field of the Invention

This invention relates to low cost multipliers and in particular to low cost multipliers that may be used in a correlator for spur cancellation.

Description of the Related Art

Signals generated by phase-locked loops and other timing circuits can include undesirable spurious tones. Canceling these spurious tones can improve the output of the timing circuits. Accordingly, improved techniques for canceling spurious tones are desirable.

SUMMARY OF EMBODIMENTS OF THE INVENTION

In an embodiment, a method includes generating a sinusoidal signal, comparing the sinusoidal signal to a first threshold, and generating a compare indication. A first input signal to a multiplexer circuit is selected as a multiplexer output signal responsive to the compare indication indicating that the sinusoidal signal is above the first threshold, and a second input to the multiplexer is selected as the multiplexer output signal responsive to the compare indication indicating sinusoidal signal is below the first threshold.

In another embodiment, an apparatus includes a compare circuit to compare a sinusoidal signal to one or more threshold values and supply a compare indication. A multiplexer circuit is coupled to select between at least a first input signal and a second input signal to the multiplexer circuit as a multiplexer output signal according to the compare indication. An accumulator accumulates the multiplexer output signal for use in generating a spur cancellation signal.

In another embodiment, a spur cancellation circuit includes a correlation circuit having a first circuit to supply a multiplication result equivalent to a multiplication of a value of a sense node by a signal corresponding to a sinusoidal signal. The first circuit includes a compare circuit to compare the sinusoidal signal to one or more threshold values and supplies a compare indication. The first circuit further includes a multiplexer circuit coupled to select between at least a value of the sense node and a negative value of the sense node as a multiplexer output signal according to the compare indication, the multiplexer output signal being the multiplication result.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein relate to a spur, or tone, cancellation system or circuit such as one incorporated in a high-performance fractional-N highly-digital phase-locked loop (PLL). One such PLL is described in U.S. Pat. No. 9,762,250, entitled "Cancellation of Spurious Tones Within A Phase-Locked Loop With A Time-To-Digital Converter", filed Jul. 31, 2014, naming Michael H. Perrott as inventor, which application is incorporated herein by reference.

Figure 1:
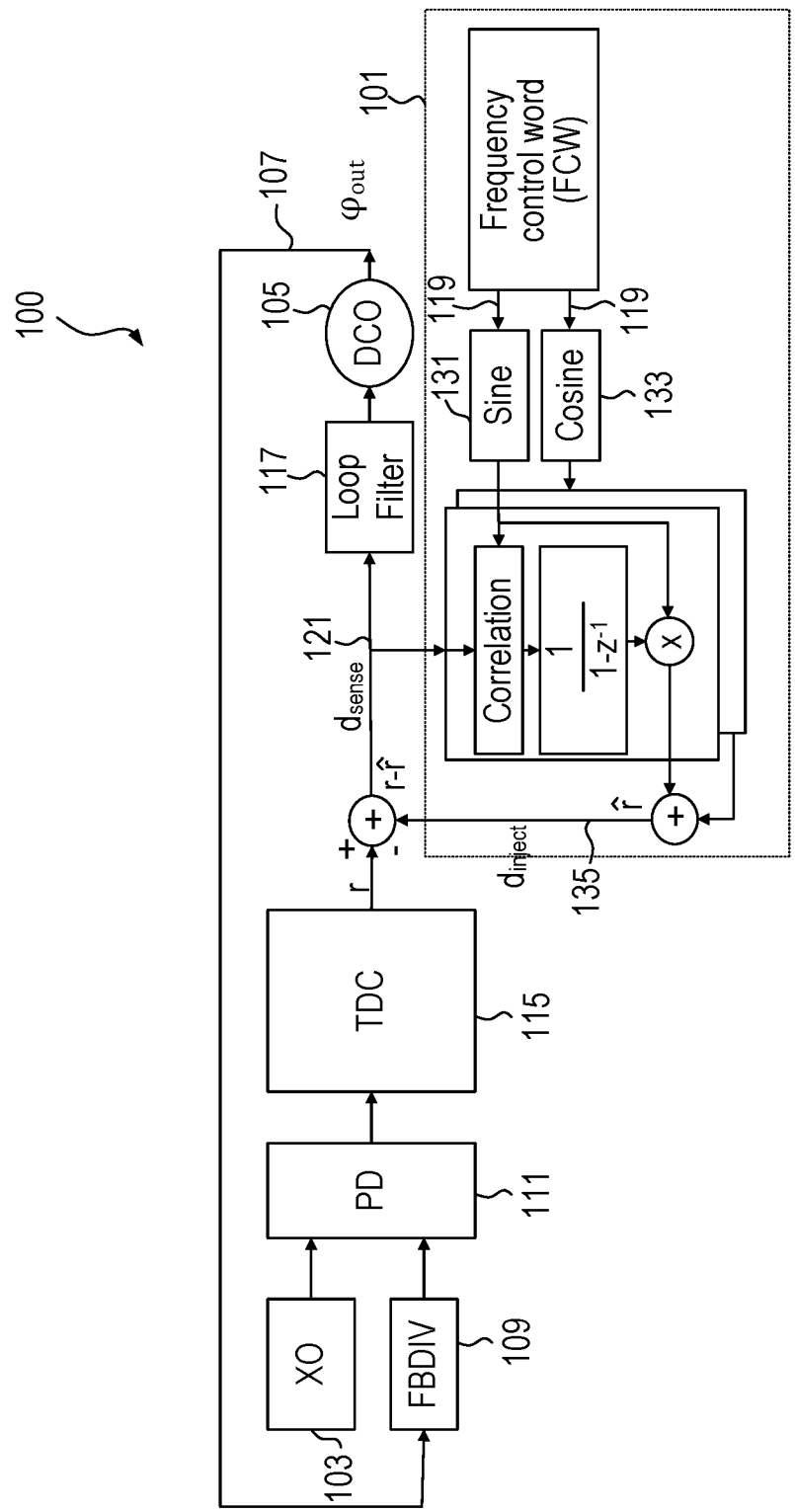
FIG. 1 illustrates a high level block diagram of a spur cancellation circuit.

FIG. 1 illustrates a high level block diagram of an embodiment of a PLL 100 with a spur cancellation circuit 101 that can utilize embodiments described herein. The PLL 100 receives a reference clock signal from crystal oscillator (XO) or other clock source 103. A digitally controlled oscillator (DCO) 105 supplies an output signal 107, which is fed back through feedback divider 109 to the phase detector 111. The phase detector supplies a time to digital converter circuit 115, which supplies a signal r that has a spurious tone (spur) canceled by the spur cancellation circuit 101 before being supplied to the loop filter 117.

The spur cancellation circuit receives a programmable frequency control word (FCW) 119 that identifies the target spur of interest (target spur frequency) to be canceled. In the spur cancellation circuit 101, sine and cosine terms 131 and 133 at the programmable target frequency are correlated against a sense node, $d_{sense}$, 121 inside the PLL. The resulting error signals drive a pair of accumulators, which set the weights on the sine and cosine signals, producing a spur cancellation signal, $d_{inject}$ 135. Negative feedback drives the amplitude and phase of the cancellation signal to be such that no spur appears (or the spur is significantly reduced) in the PLL output signal 107.

Figure 2:
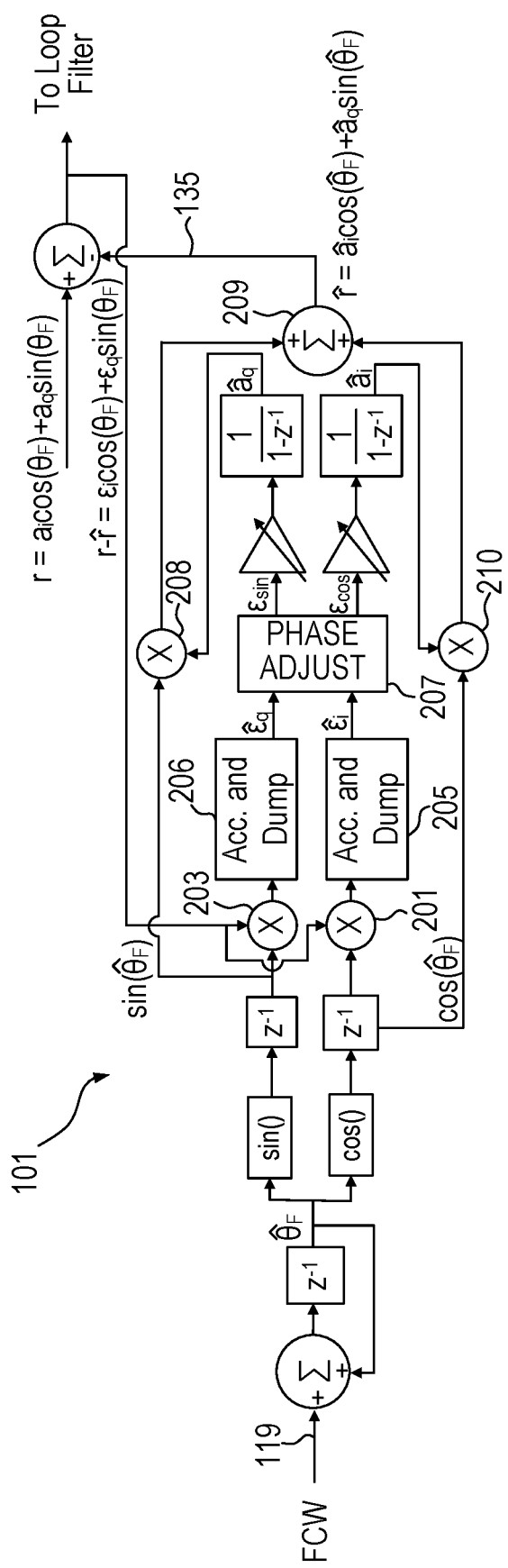
FIG. 2 illustrates additional details of the spur cancellation circuit.

FIG. 2 illustrates an embodiment of the spur cancellation circuit 101 in more detail. In the embodiment of FIG. 2, the two correlators are respectively implemented with high-resolution multipliers 201 and 203 and accumulate-and-dump circuits 205 and 206. The accumulate and dump circuits 205 and 206 average a number of samples by accumulating samples over the chosen measurement time frame (N samples) and then "dumping" the resulting value. A phase adjust block 207 follows the accumulate and dump circuits to compensate for PLL dynamics. The final weights on the sine and cosine terms are $â_q$ and $â_i$, which are the scale factors for the sine and cosine components of the cancellation signal. The weights multiply the sine and cosine terms (sin $\hat{\theta}_F$ and cos $\hat{\theta}_F$) in multipliers 208 and 210 and summer 209 sums together the multiplication results and supplies the spur cancellation signal $d_{inject}$ ($\hat{r}$ in FIG. 2) to cancel the spurious tone at the frequency specified by FCW. Note that the spur cancellation circuit can be implemented digitally.

Figure 3:
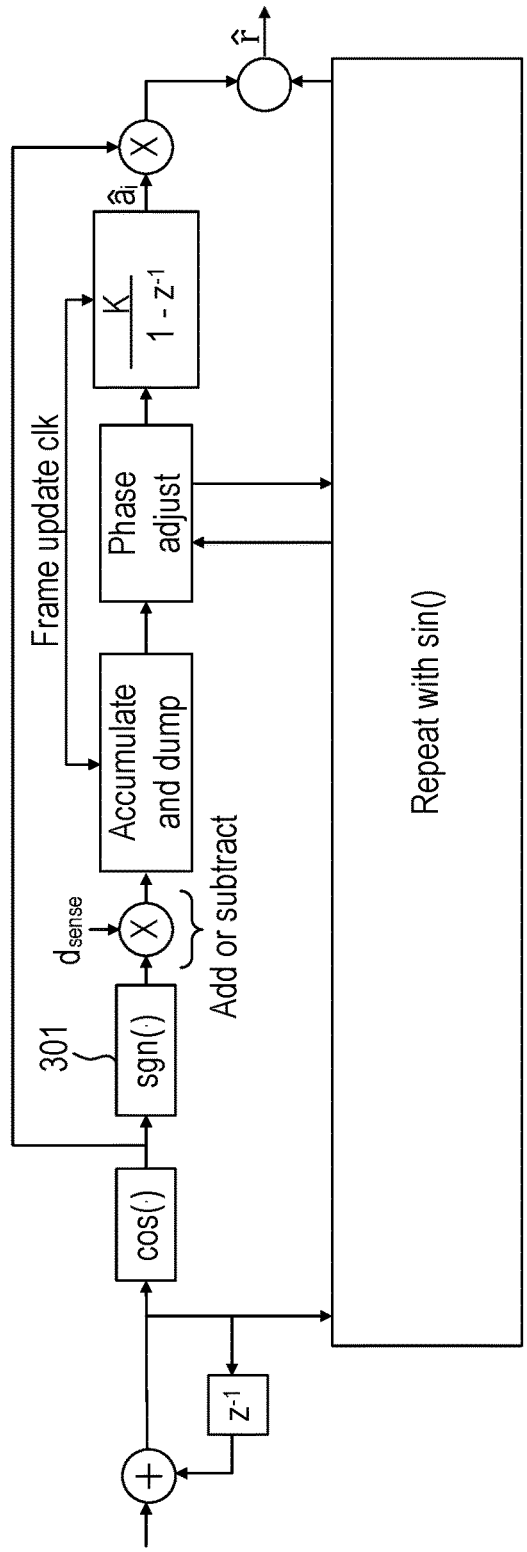
FIG. 3 illustrates an embodiment of a lower cost multiplier implementation in a correlator of the spur cancellation circuit.

A significant part of the area and power used by the spur canceller above is in the four multipliers. Two of them (201 and 203) are found in the two correlators, which can be replaced with lower cost circuits in power and area by correlating with a signal that correlates with sine and cosine, but are lower resolution signals. The cheapest such signal to use is a square wave, as it takes only two values. FIG. 3 illustrates a portion of a modified spur canceller with a high level block diagram of the correlator with a lower cost multiplier circuit in the correlator. For simplicity, FIG. 3 shows only the cosine part of the spur canceller, although the sine part is implemented in the same way.

Figure 4:
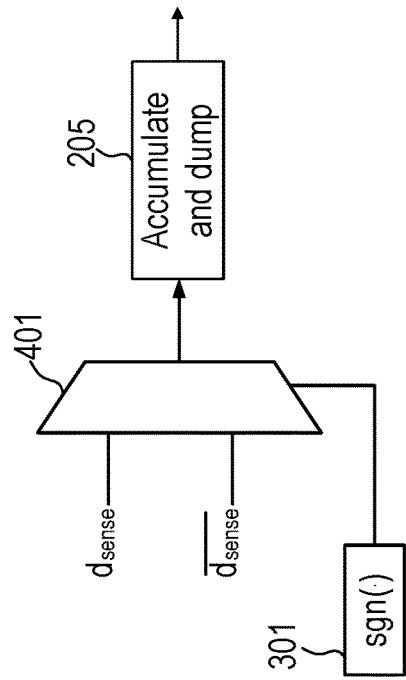
FIG. 4 illustrates a low cost implementation of a multiplier using a sign function and a multiplexer that functions to multiply the sense node signal with a square wave that is based on the sinusoidal signal to be correlated with the sense node signal.

In the embodiment of FIG. 3, instead of the cosine going directly into the multiplier, it first goes through a sign operation (sgn) 301. The sign operation determines if the cosine is above or below 0 to produce a square wave. That is shown conceptually as going through a multiplier, but multiplying $d_{sense}$ by 1 or −1 is equivalent to a multiplexer 401 that selects either $d_{sense}$ or −$d_{sense}$, depending on the value of the square wave as shown in FIG. 4. That can be understood by looking at the Fourier series of a square wave, which expresses the square wave as a sum of sinusoids at the frequency of the square wave and its harmonics. Thus, in the case when $d_{sense}$ only contains a spur at the target frequency, it is detected by the correlator and the spur canceller functions as normal.

Note that there is a gain introduced here, equal to the weight of the fundamental term of the Fourier series of the square wave, which affects the adaptation bandwidth of the spur canceller. The drawback of using this correlator is that the spur canceller becomes sensitive to spurs at harmonics of the target frequency. That is because the harmonics present in the square wave correlate with those spurs and add them to the error signal. That is not generally a limitation for several reasons. First, it is unlikely that there are multiple spurs of similar magnitude at harmonically-related frequencies. Second, it is only an issue if the second spur is not cancelled. If there is a spur at another frequency of appreciable size, it by itself would likely violate desired performance levels and it must be addressed by itself. Using the correlator such as shown in FIG. 3, reduces the cost of a spur canceller, making it easier to use multiple spur cancellers to cancel multiple spurs, in which case there is no issue. Third, the error that the harmonics do introduce causes the spur to be reduced to a level proportional to the harmonically-related spur. How much below is determined by the ratio of the Fourier series coefficient of that harmonic to the fundamental's coefficient.

Figure 5:
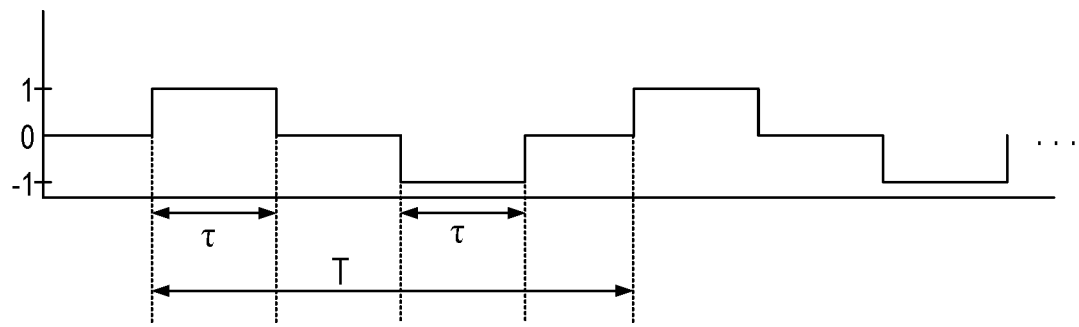
FIG. 5 illustrates a reduced resolution sinusoid that uses three values.

FIG. 5 illustrates another embodiment that has one more input to the multiplexer: zero. That is equivalent to multiplying by a sine wave represented by 1.5 b (since there are three values (−1, 0, 1)). That signal has a Fourier series whose overtone coefficients are smaller than that for a square wave. There is flexibility in how to set the "shape" of the periodic signal. That is, the amount of the period that is the value zero, +1, or −1, as shown in FIG. 5.

Figure 6:
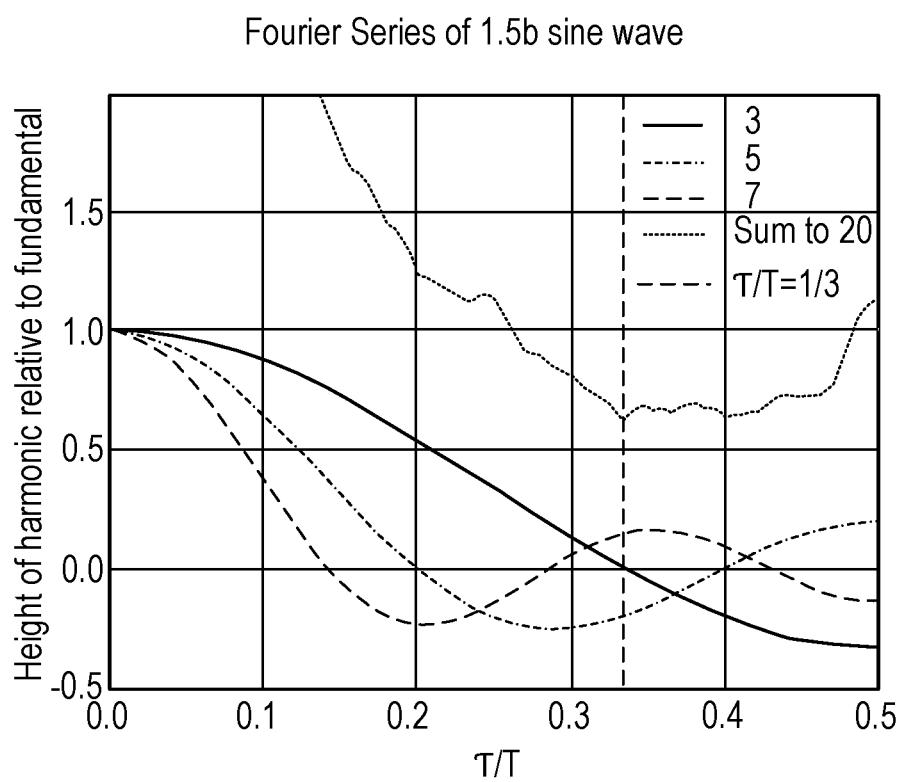
FIG. 6 illustrates how the height of harmonics of the spur target frequency varies with the width of the positive and negative portions of the reduced resolution sinusoid that uses three values.

The Fourier series coefficients are $$a_n = \frac{4}{n\pi}\sin\left(\frac{n\pi\tau}{T}\right),$$

where $\tau$ (tau) is the amount of the time that the signal is positive, and the time spent negative, and T is the entire period, n is odd (even terms are zero). Individual harmonics can be optimized by setting $\tau$, but a broad optimum that covers many harmonics and cancels the effects of spurs at the third harmonic is to set $\tau=T/3$. That is equivalent to slicing a sinusoid at 0.5 and −0.5 (assuming peak values of ±1). That is, input sinusoid values above 0.5 are set to 1, values below −0.5 are set to −1, and values between 0.5 and −0.5 are set to 0. FIG. 6 shows the height of harmonics (3, 5, 7, and sum to 20) relative to the fundamental for a Fourier series of a 1.5b sine wave for various values of $\tau/T$. As can be seen, the for $\tau/T=\frac{1}{3}$, the third harmonic is zero.

Figure 7:
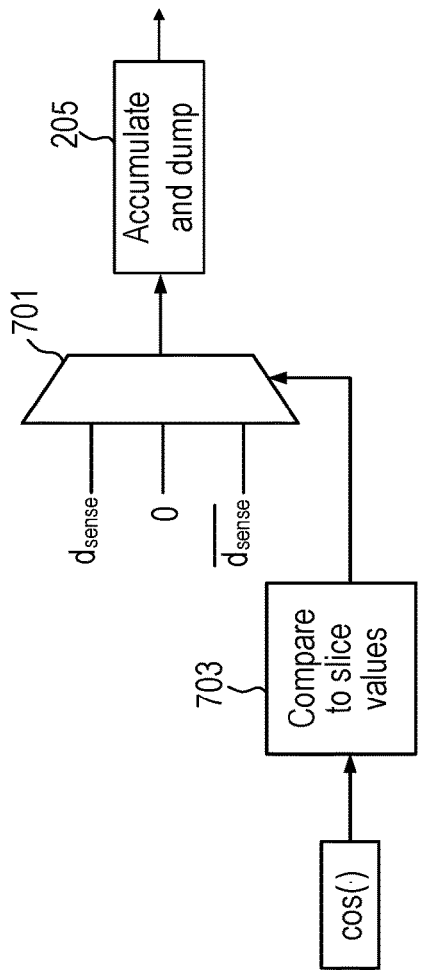
FIG. 7 illustrate a low cost implementation of a multiplier using a comparator and a multiplexer that functions to multiply the sense node signal by a reduced resolution sinusoidal signal that has three values, positive $d_{sense}$, negative $d_{sense}$, and zero.

The embodiment illustrated by FIG. 5 can be implemented as shown in FIG. 7 with a three input multiplexer 701 to select $d_{sense}$, −$d_{sense}$, or zero according to the value of the sine or cosine value. Compare logic 703 determines whether the cosine is above 0.5, below −0.5, or between 0.5 and −0.5, and provides the appropriate selection signal. Other embodiments increase the size of the multiplexer above three inputs, and compute low-resolution scalings of $d_{sense}$ using shift-and-add operations.

Figure 8:
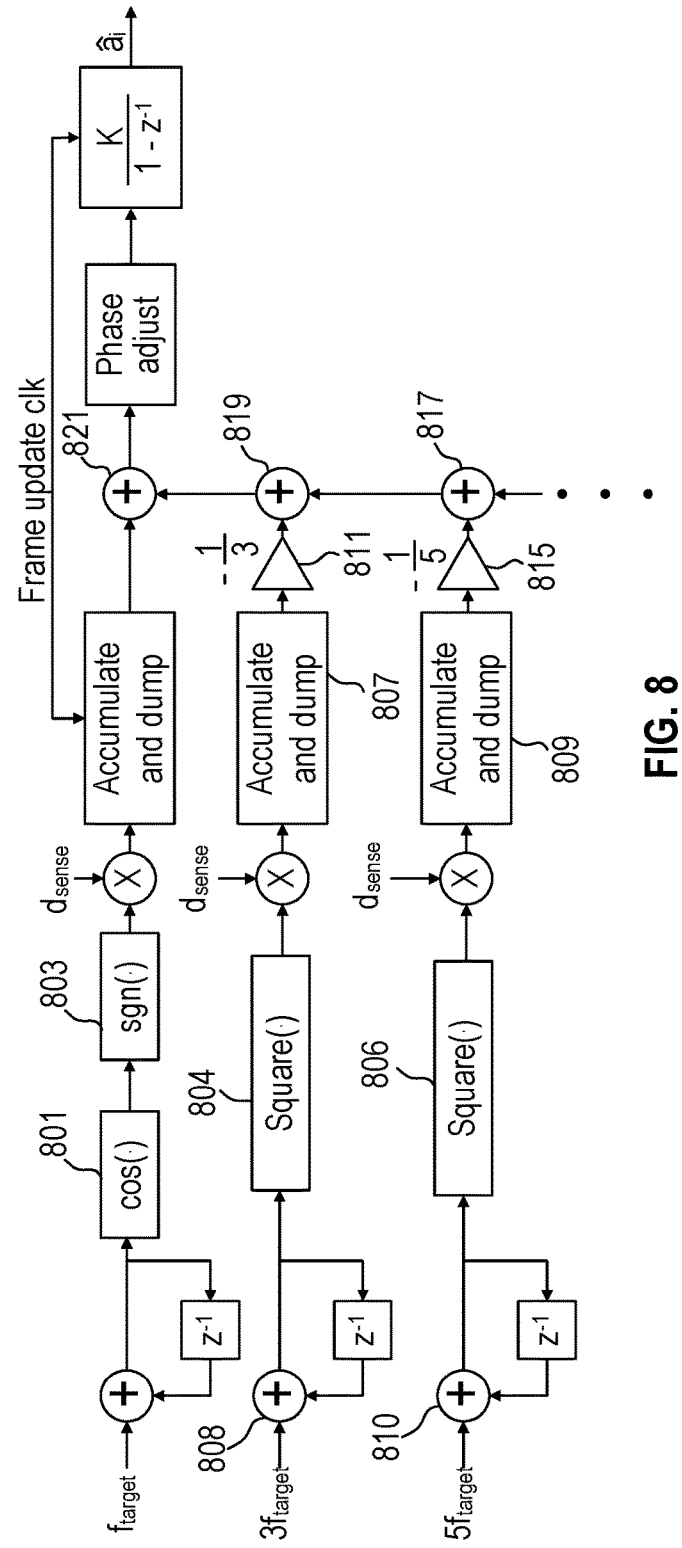
FIG. 8 illustrates an embodiment of a cosine portion of a correlator in a spur cancellation circuit that reduces the effects of harmonics on the spur cancellation signal that are caused by the use of a low cost multiplier.

FIG. 8 illustrates another embodiment that reduces sensitivity to harmonically-related spurs by sensing the related spurs, but not canceling them in a separate spur cancellation circuit. Using the same low-cost correlators, the offending harmonics can be measured and subtracted from the spur cancellation signal. The embodiment of FIG. 8 assumes a square wave is used for the multiplication as described, e.g., with relation to FIGS. 3 and 4. Here the third and fifth harmonics are cancelled as an example. Again, the multiplier is implemented with a multiplexer as shown in FIG. 4. The cosine generator function 801 in combination with the sgn function 803 performs the phase to square wave generation by determining whether the cosine is above or below the threshold, e.g., above or below zero. The output of the sgn function selects the appropriate input to the multiplexer as shown in FIG. 4, which is equivalent to multiplying by 1 or −1. Rather than using a cosine generator (which utilizes a cosine table to generate the cosine value) and a sgn function, in an embodiment, the third and fifth harmonic paths use square functions 804 and 806 to generate square waves with values 1 or −1 based on phase information supplied by the respective summers 808 and 810. The square function can be more efficiently implemented than using the cosine and sgn functions with additional cosine tables. Embodiments use the low cost multiplier of FIG. 4 in conjunction with the square function. In other embodiments, the harmonic paths use the cosine and sgn functions rather than the square function. The target frequency ($f_{target}$) path could also use the square function instead of the cosine and sgn function but a cosine table is required later in the cancellation processing. Accumulate and dump circuit 807 and 809 for the harmonic paths supply scaling circuits 811 and 815. The scaling circuits 811 and 815 scale the output of phase to square wave generation circuits to scale the output by scaling factors −⅓ and −⅕, which come from the Fourier series coefficients of the square wave. After scaling, the output of the scaling circuits are summed with scaled outputs of other harmonics in summer circuits 817 and 819 and finally combined with the output of the accumulate and dump circuit for the fundamental frequency of the spur ($f_{target}$) in summer 821 to reduce the impact of the harmonics of the spur cancellation signal at the target frequency. These scaling factors operate at a slow rate after the accumulate-and-dump, so the scaling can be performed in serial with little hardware. The harmonics used in any particular embodiment are selected based on which harmonics are of concern for a given targeted spur, not necessarily the third and fifth harmonics shown in the embodiment of FIG. 8. While FIG. 8 shows the modification of the cosine weight $\hat{a}_q$, the modification of the sine weight $\hat{a}_i$ uses the same circuit except for a sine wave instead of a cosine wave.

Note that the various embodiments shown herein can be applied to other systems where a signal is correlated against a sinusoid, not just for spur cancellation. However, other applications may be more sensitive to the effects of spurs or signal content at harmonics of the targeted spur.

Thus, various aspects have been described relating to more efficient multiplication for use in correlating a programmable target frequency of a spur against a sense node. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    generating a sinusoidal signal;
    comparing the sinusoidal signal to a first threshold and generating a compare indication;
    selecting a first input signal to a multiplexer circuit as a multiplexer output signal responsive to the compare indication indicating the sinusoidal signal is above the first threshold;
    selecting a second input signal to the multiplexer circuit as the multiplexer output signal responsive to the compare indication indicating the sinusoidal signal is below the first threshold; and
    wherein the compare indication indicates a sign of the sinusoidal signal.

2. The method as recited in claim 1 wherein the first input signal is a value of a sense node in a phase-locked loop.

3. The method as recited in claim 1 further comprising selecting the first input signal or the second input signal according to the sign, where the first input signal is a value of a sense node and the second input signal is a negative value of the sense node.

4. The method as recited in claim 3 wherein the comparing and the multiplexer circuit convert the sinusoidal signal to a square wave and the multiplexer output signal provides the value of the sense node multiplied by the square wave having a value of one or minus one.

5. The method as recited in claim 3 wherein the sinusoidal signal is at a frequency that is a harmonic of a target frequency of a spur to be canceled and the method further includes:
    accumulating an error signal that is an output of the multiplexer circuit in an accumulator circuit;
    scaling an accumulator output of the accumulator circuit by a scale factor based on the harmonic;
    adjusting a second accumulated signal corresponding to a second error signal indicating a correlation between the value of the sense node and a second sinusoidal signal at the target frequency; and
    generating a weighting factor for the second sinusoidal signal for use in generating a spur cancellation signal to cancel the spur at the target frequency.

6. A method comprising:
    generating a sinusoidal signal;
    comparing the sinusoidal signal to a first threshold and a second threshold;
    generating a compare indication, wherein the compare indication indicates whether the sinusoidal signal is above the first threshold, between the first threshold and the second threshold, or below the second threshold;
    selecting a first input signal to a multiplexer circuit as a multiplexer output signal responsive to the compare indication indicating the sinusoidal signal is above the first threshold; and
    selecting a second input signal to the multiplexer circuit as the multiplexer output signal responsive to the compare indication indicating the sinusoidal signal is below the second threshold.

7. The method as recited in claim 6 further comprising:
    selecting a third input signal to the multiplexer circuit as the multiplexer output signal responsive to the compare indication indicating the sinusoidal signal is below the first threshold and above the second threshold.

8. The method as recited in claim 7 wherein the first input signal is a positive value of a sense node, the second input signal is a negative value of the sense node, and the third input signal is zero.

9. An apparatus comprising:
    a compare circuit to compare a sinusoidal signal to one or more threshold values and supply a compare indication;
    a multiplexer circuit coupled to select between at least a first input signal and a second input signal to the multiplexer circuit as a multiplexer output signal according to the compare indication; and
    an accumulator to accumulate the multiplexer output signal for use in generating a spur cancellation signal.

10. The apparatus as recited in claim 9 wherein the first input signal is a value of a sense node and the second input signal is a negative value of the sense node.

11. The apparatus as recited in claim 10 wherein the multiplexer circuit is part of a correlator circuit that correlates the sinusoidal signal to the value of the sense node as part of generating the spur cancellation signal.

12. The apparatus as recited in claim 10 wherein the compare indication indicates a sign of the sinusoidal signal and wherein the multiplexer circuit is configured to select the first input signal or the second input signal according to the sign.

13. The apparatus as recited in claim 12 wherein the compare circuit and the multiplexer circuit provide a function equivalent to multiplying the value of the sense node by a square wave having a value of one or minus one.

14. The apparatus as recited in claim 12 wherein the sinusoidal signal is at a frequency that is a harmonic of a target frequency of a spur to be canceled and the apparatus further comprises:
    an accumulator circuit to accumulate the multiplexer output signal as an error signal;
    a scaling circuit to scale an accumulator output of the accumulator circuit by a scale factor based on the harmonic;
    a summing circuit to adjust a second accumulated signal corresponding to a second error signal indicating correlation between the value of the sense node and a second sinusoidal signal at the target frequency; and wherein a weighting factor is generated for the second sinusoidal signal using an output of the summing circuit, the weighting factor for use in generating a spur cancellation signal to cancel the spur at the target frequency.

15. The apparatus as recited in claim 9,
wherein the one or more threshold values includes a first threshold and a second threshold and the compare circuit compares the sinusoidal signal to the first threshold and to the second threshold; and
wherein the compare circuit provides the compare indication to the multiplexer circuit as a select signal, the compare indication indicating whether the sinusoidal signal is above the first threshold, between the first and second threshold, or below the second threshold.

16. The apparatus as recited in claim 15,
wherein the multiplexer circuit supplies the first input signal as the multiplexer output signal responsive to the compare indication indicating that the sinusoidal signal is above the first threshold;
wherein the multiplexer circuit supplies the second input signal to the multiplexer circuit as the multiplexer output signal responsive to the compare indication indicating that the sinusoidal signal is below the second threshold;
wherein the multiplexer circuit is responsive to supply a third input signal to the multiplexer circuit as the multiplexer output signal responsive to the compare indication indicating the sinusoidal signal is below the first threshold and above the second threshold; and
wherein the first input signal is a positive value of a sense node in a phase-locked loop, the positive value of the sense node being supplied to a loop filter, the second input signal is a negative value of the sense node, and the third input signal is zero.

17. A spur cancellation circuit comprising:
a correlation circuit having a first circuit to supply a multiplication result equivalent to a multiplication of a value of a sense node by a signal corresponding to a sinusoidal signal, wherein the first circuit includes,
a compare circuit to compare the sinusoidal signal to one or more threshold values and supply a compare indication; and
a multiplexer circuit coupled to select between at least a value of the sense node and a negative value of the sense node as a multiplexer output signal according to the compare indication, the multiplexer output signal being the multiplication result.

18. The spur cancellation circuit as recited in claim 17 wherein the compare indication indicates a sign of the sinusoidal signal and wherein the multiplexer circuit is configured to select the value of the sense node or the negative value of the sense node as the multiplexer output signal according to the sign.

19. The spur cancellation circuit, as recited in claim 17,
wherein the one or more threshold values includes a first threshold and a second threshold and the compare circuit compares the sinusoidal signal to the first threshold and to the second threshold;
wherein the compare circuit provides the compare indication to the multiplexer circuit as a select signal, the compare indication indicating whether the sinusoidal signal is above the first threshold, between the first and second threshold, or below the second threshold;
wherein the multiplexer circuit supplies the value of the sense node as the multiplexer output signal responsive to the compare indication indicating that the sinusoidal signal is above the first threshold;
wherein the multiplexer circuit supplies the negative value of the sense node as the multiplexer output signal responsive to the compare indication indicating that the sinusoidal signal is below the second threshold; and
wherein the multiplexer circuit is responsive to supply a zero as the multiplexer output signal responsive to the compare indication indicating the sinusoidal signal is below the first threshold and above the second threshold.

* * * * *